US008813349B2

(12) United States Patent
In 'T Veld et al.

(10) Patent No.: US 8,813,349 B2
(45) Date of Patent: Aug. 26, 2014

(54) DEVICE FOR SEPARATING ELECTRONIC COMPONENTS

(75) Inventors: Frederik Hendrik In 'T Veld, Brakel (NL); Mark Hermans, Geldermalsen (NL); Wilhelmus Hendrikus Johannes Harmsen, AM Wehl (NL); Johannes Gerhardus Augustinus Zweers, Wehl (NL)

(73) Assignee: FICO B.V., Duiven (NL)

( * ) Notice: Subject to any disclaimer, the term of this patent is extended or adjusted under 35 U.S.C. 154(b) by 659 days.

(21) Appl. No.: 13/002,705

(22) PCT Filed: Jul. 9, 2009

(86) PCT No.: PCT/NL2009/050414

§ 371 (c)(1),
(2), (4) Date: Mar. 28, 2011

(87) PCT Pub. No.: WO2010/005307

PCT Pub. Date: Jan. 14, 2010

(65) Prior Publication Data

US 2011/0197727 A1 Aug. 18, 2011

(30) Foreign Application Priority Data

Jul. 11, 2008 (NL) ..................................... 2001790

(51) Int. Cl.
*B23P 19/00* (2006.01)
*H05K 13/04* (2006.01)
*H05K 3/30* (2006.01)
*B28D 5/00* (2006.01)
*B28D 5/02* (2006.01)

(52) U.S. Cl.
CPC ............. *B28D 5/029* (2013.01); *B28D 5/0082* (2013.01)
USPC ............................................. 29/729; 29/835

(58) Field of Classification Search
CPC .............................. B28D 5/029; B28D 5/0082
USPC .................................................. 29/729, 835
See application file for complete search history.

(56) References Cited

U.S. PATENT DOCUMENTS 3,816,700 A * 6/1974 Weiner et al. ............ 219/121.68
4,141,456 A * 2/1979 Hart .............................. 414/787
4,407,262 A * 10/1983 Wirz et al. ................. 125/13.01

(Continued)

FOREIGN PATENT DOCUMENTS

EP 1028455 A2 8/2000
GB 2284304 A 5/1995

(Continued)

*Primary Examiner* — David Angwin
(74) *Attorney, Agent, or Firm* — The Webb Law Firm, P.C.

(57) ABSTRACT

A device for separating electronic components including sawing means and positioning means, wherein between the positioning means and the sawing means at least one transfer position is defined for the purpose of transferring positioned electronic components. A separating device for electronic components including sawing means, positioning means, inspection means, and sorting means, wherein between the positioning means and the sawing means at least one transfer position is defined for the purpose of transferring positioned electronic components between the positioning means and the sawing means, and wherein between the inspection means and the sorting means at least another transfer position is defined for the purpose of transferring the inspected separated electronic components between the inspection means and the sorting means.

10 Claims, 3 Drawing Sheets

(56) References Cited

U.S. PATENT DOCUMENTS

| | | | | |
|---|---|---|---|---|
| 6,345,616 | B1 * | 2/2002 | Umahashi | 125/13.01 |
| 6,446,354 | B1 * | 9/2002 | Na | 34/236 |
| 6,607,117 | B1 * | 8/2003 | Kang et al. | 228/103 |
| 7,939,374 | B2 * | 5/2011 | Yang | 438/113 |
| 7,975,710 | B2 * | 7/2011 | Lai et al. | 134/135 |
| 8,011,058 | B2 * | 9/2011 | Cheng et al. | 15/310 |
| 8,037,996 | B2 * | 10/2011 | Cheng et al. | 198/468.3 |
| 8,132,305 | B2 * | 3/2012 | Choi et al. | 29/33 P |
| 8,167,524 | B2 * | 5/2012 | Cheng et al. | 414/226.01 |
| 8,251,422 | B2 * | 8/2012 | Cheng et al. | 294/183 |
| 2006/0056955 | A1 * | 3/2006 | Kim et al. | 414/806 |
| 2011/0197727 | A1 * | 8/2011 | In 'T Veld et al. | 83/23 |

FOREIGN PATENT DOCUMENTS

| | | | |
|---|---|---|---|
| NL | 2000028 | | 11/2007 |
| WO | 2005109492 | A1 | 11/2005 |
| WO | 2007105953 | A1 | 9/2007 |

* cited by examiner

DEVICE FOR SEPARATING ELECTRONIC COMPONENTS

BACKGROUND OF THE INVENTION

1) Field of the Invention

The present invention relates to a device for separating electronic components, provided with: A) sawing means for sawing the electronic components, comprising: two parallel and rotatable drive shafts with saw blades mounted on the shafts; and a saw manipulator for engaging, carrying and displacing the electronic components relative to the saw blades, and B) positioning means for aligning the electronic components for separating before they are fed to the sawing means, comprising at least one camera for detecting the position of supplied electronic components for separating.

2) Description of the Prior Art

The separation of assembled electronic components has diverse applications. Examples are the dividing of wafers and the dividing of carriers (also referred to as lead frames or boards) with electronic components optionally encapsulated with for instance a cured epoxy. The separated electronic components are usually only several millimeters in size, wherein there is a continuing trend toward further miniaturization. Depending on the conditions, use is made in the known method of separation of sawing machines with one or more rotating saw blades with which the products for processing are sawn through. The assembly of the electronic components is picked up by a manipulator, held fast, positioned and displaced relative to the saw blade along the desired cutting lines, along which the assembly is therefore sawn. The electronic components are held in place by the manipulator during sawing thereof.

Because a large number of parallel saw cuts usually have to be made in a product, it is known to apply a separating device with two parallel saw blades which are driven by two different spindles such that the mutual distance between the saw blades is adjustable subject to the dimensions of the products to be processed and the manner in which the saw cuts are made. The existing devices function well, but the existing sawing equipment is relatively costly and the capacity thereof is limited.

The present invention has for its object to provide an improved device and method of the type stated in the preamble, with which a substantial increase in capacity can be realized at limited additional cost.

SUMMARY OF THE INVENTION

The invention provides for this purpose a device for separating electronic components, wherein between a positioning means (B) and a sawing means (A) at least one transfer position is defined for the purpose of transferring positioned electronic components between the positioning means (B) and the sawing means (A). The positioning means for aligning the electronic components to be separated will herein comprise a separate positioning manipulator for engaging, carrying and displacing the electronic components for separating relative to the camera. Defined between the positioning means and the sawing means will be at least one transfer position which is accessible to the positioning manipulator for the purpose of delivering electronic components for separating with the positioning manipulator, and this transfer position is also accessible to the saw manipulator for the purpose of engaging with the saw manipulator the electronic components for separating which have been delivered by the positioning manipulator. Other than in the prior art, such a separating device has two separate manipulators (the positioning manipulator and the saw manipulator) with which successive sub-processes are operated.

Heretofore there has been much resistance to hand-over of electronic components for separating (and separated electronic components) once they have been engaged, since it is precisely this hand-over which represents a critical process step. Another reason for no longer releasing engaged electronic components before the separating processes have been completed is that the positioning of the electronic components, obtained with effort, may hereby be lost again; holding the electronic components engaged represents a "guarantee" that the position of the electronic components does not shift. Despite the alleged advantages of performing positioning and sawing without hand-over of the engaged electronic components, the present invention provides the insight that it can nevertheless be advantageous to perform these sub-processes with individual manipulators. The drawbacks of transferring the electronic components are more than compensated by the advantages which this provides. The operations with the positioning means and the sawing means can now be performed at least partially in parallel with each other, which will result in a considerable reduction in the cycle time of the separating device. The positioning and sawing have heretofore taken place consecutively (serially) so that the cycle time consisted at least of the full time required for the positioning plus the time required for the sawing. According to the invention the sum of these two processing times no longer defines the time required, but the longer of the two sub-cycle times. The more expensive module(s) is/are hereby better utilized, whereby the costs per processed product will be lower.

In a particular embodiment variant the electronic components are transferred from the positioning manipulator to the saw manipulator via a (first) lay-off position where the electronic components are laid off by the positioning manipulator before being gripped by the saw manipulator. With such a lay-off position the positioning manipulator and the saw manipulator need not connect to each other and hand over the electronic components directly, they can be laid off and subsequently picked up again. This results in an even further-reaching unlinking of the positioning and sawing operations. An additional advantage is that the lay-off position can be employed for the purpose of positioning when (according to a preferred variant) the lay-off position is displaceable. This can be realized for instance by a lay-off position for the electronic components which is displaceable (to limited extent) in this plane in order to thus compensate for detected undesirable variations in the desired positioning of the electronic components before the electronic components are engaged by the saw manipulator. It is also noted that the positioning can be supported by a single camera, although in practice a plurality of cameras will often be applied for this purpose, for instance in order to enable a phased alignment (a pre-alignment and a definitive alignment). It is also possible to connect the device in optimum manner for other connected equipment.

In a preferred embodiment the separating device is also provided with: cleaning means for cleaning the separated electronic components after they have been processed by the sawing means, comprising: a washing system for washing the separated electronic components using a cleaning liquid, and a cleaning manipulator for engaging, carrying and displacing the separated electronic components relative to the washing system, wherein between the sawing means (A) and the cleaning means (C) at least one transfer position is defined for the purpose of transferring sawn electronic components between the sawing means (A) and the cleaning means (C). It is here also possible in a preferred variant to opt to incorporate between the sawing means and the cleaning means at least one (second) lay-off position which is accessible to the saw manipulator for the purpose of laying off sawn electronic components with the saw manipulator and which is also accessible to the cleaning manipulator for the purpose of picking up with the cleaning manipulator the sawn electronic components laid off by the saw manipulator.

Alternatively, the cleaning manipulator can also hand over the electronic components directly from the saw manipulator so that a separate lay-off position is not present. According to both variants, the cleaning (with liquid) of the sawn electronic components (which is usually combined with drying of the cleaned electronic components) is also separated as process from the sawing, so that the cleaning can also be performed in parallel with the sawing. The electronic components (which have been sawn and so generally consist of a larger quantity of separate electronic components, usually in a matrix) are here again transferred from the saw manipulator to the cleaning manipulator, optionally via a lay-off position. The advantages already described above of the transfer from the positioning manipulator to the saw manipulator are again realized in similar manner with the transfer from the saw manipulator to the cleaning manipulator.

In a still further improved embodiment variant the separating device is also provided with: inspection means for inspecting the cleaned and separated electronic components after they have been processed by the cleaning means, comprising: at least one inspection camera for inspecting the cleaned and separated electronic components, and an inspection manipulator for engaging, carrying and displacing the cleaned and separated electronic components relative to the inspection camera, wherein between the cleaning means (C) and the inspection means (D) at least one transfer position is defined for the purpose of transferring cleaned electronic components between the cleaning means (C) and the inspection means (D). This (third) transfer position is accessible to the cleaning manipulator for the purpose of delivering cleaned electronic components with the cleaning manipulator and which is also accessible to the inspection manipulator for the purpose of gripping with the inspection manipulator the cleaned electronic components delivered by the cleaning manipulator. It is also the case here that in a preferred variant at least one (third) lay-off position is incorporated between the cleaning means and the inspection means which is accessible to the cleaning manipulator for the purpose of laying off cleaned electronic components with the cleaning manipulator, and which is also accessible to the inspection manipulator for the purpose of picking up with the inspection manipulator cleaned electronic components laid off by the cleaning manipulator. Alternatively, the inspection manipulator can also hand over the electronic components directly from the cleaning manipulator so that a separate lay-off position is not present. These additional measures again make it possible to separate two processing steps such that they can be performed in parallel. For the advantages hereof reference is made to the advantages of unlinking two processing steps already described above. The inspection can be performed as desired from one side, although a still further-reaching inspection can also be carried out by inspection from two sides. Use can be made for this purpose of two different cameras (one with inspection from above and one with inspection from below). The components for inspecting can desirably be displaced for this purpose over a camera and then under a camera such that first the underside of the electronic components is free for inspection and the top side is subsequently free for inspection. Use can herein be made of a carrier for the electronic components which is displaceable (for instance displaceable under a stationary camera). Another advantageous variant in this respect relates to picking up every other sawn electronic component for inspection. A part of the matrix of electronic components (as according to the squares of the same colour on a chequer-board) are thus always picked up, which facilitates the inspection of the electronic components, and in particular also enables better inspection of the edges of the electronic components.

In another further embodiment variant the device is also provided with sorting means for sorting the inspected, cleaned and separated electronic components after they have been detected by the inspection means, comprising: at least two transfer positions for inspected, cleaned and separated electronic components, and an inspection manipulator for engaging, carrying and displacing the inspected, cleaned and separated electronic components to the different lay-off positions, wherein between the inspection means (D) and the sorting means (E) at least one transfer position is defined for the purpose of transferring inspected electronic components between the inspection means (D) and the sorting means (E). In accordance with the steps, already described in the foregoing, of unlinking successive processing steps into separate processing steps (to be performed in parallel), the processing cycle of the electronic components can hereby also be further shortened. The electronic components to be discharged can be placed as desired on carriers (trays) or thrown into a container or waste bin.

The present invention also provides a device for separating electronic components, provided with: A) sawing means for sawing the electronic components, comprising: two parallel and rotatable drive shafts with saw blades mounted on the shafts, and a saw manipulator for engaging, carrying and displacing the electronic components relative to the saw blades; D) inspection means for inspecting the separated electronic components, comprising: at least one inspection camera for inspecting the separated electronic components, and an inspection manipulator for engaging, carrying and displacing the separated electronic components relative to the inspection camera; and E) sorting means for sorting the separated electronic components, comprising: at least two transfer positions for separated electronic components and a sorting manipulator for engaging, carrying and displacing the separated electronic components to different transfer positions; wherein between the inspection means (D) and the sorting means (E) at least one transfer position is defined for the purpose of transferring the inspected separated electronic components between the inspection means (D) and the sorting means (E). It is also the case for this separating device that heretofore there has been much resistance to hand-over of electronic components once they have been engaged, since it is precisely this hand-over which represents a critical process step. Despite the alleged advantages of performing positioning and sawing without hand-over of the engaged electronic components, the present invention provides the insight, as already described above, that it can nevertheless be advantageous to perform these sub-processes with individual manipulators. The drawbacks of transferring the electronic components are more than compensated by the advantages which this provides.

The operations with the inspection means (D) and the sorting means (E) can now be performed partially in parallel with each other, which particularly in the processing of batches with many products (this will in practice generally mean smaller electronic components) will result in a considerable reduction in the cycle time of the separating device. Heretofore these operations took place consecutively (serially) so that the cycle time consisted at least of the full time required for inspection plus the time required for sorting. According to the invention the sum of these two processing times no longer determines the time required, but the longer of the two sub-cycle times. For the further advantages reference is made here to the advantages already mentioned above of the unlinking already described in the foregoing of sub-processes heretofore coupled in series in separating devices.

In a preferred variant the device is also provided with: B) positioning means for aligning the electronic components for separating before they are fed to the sawing means, comprising: at least one camera for detecting the position of supplied electronic components for separating, and a positioning manipulator for engaging, carrying and displacing the electronic components for separating relative to the camera; wherein between the positioning means (B) and the sawing means (A) at least one transfer position is defined for the purpose of transferring the positioned electronic components between the positioning means (B) and the sawing means (A). Again the electronic components are here transferred from manipulator to manipulator, optionally via a lay-off position. The advantages of transfer already described above are once again realized in similar manner due to the transfer from the positioning manipulator to the saw manipulator.

In yet another variant the device is also provided with: C) cleaning means for cleaning the separated electronic components after they have been processed by the sawing means, comprising: a washing system for washing the separated electronic components using a cleaning liquid, and a cleaning manipulator for engaging, carrying and displacing the separated electronic components relative to the washing system, wherein between the sawing means (A) and the cleaning means (C) at least one transfer position is defined for the purpose of transferring separated electronic components between the sawing means (A) and the cleaning means (C). It is also possible for at least one transfer position to be defined between the cleaning means (C) and the inspection means (D) for the purpose of transferring cleaned separated electronic components between the cleaning means (C) and the inspection means (D). In accordance with the steps already described in the foregoing for unlinking successive processing steps into individual processing steps (to be performed in parallel), the processing cycle of the electronic components can hereby also be further shortened.

For a coordinated relative control of the aligning means and the sawing means the device is preferably provided with a central control unit co-acting with at least two of the positioning means (B) and the sawing means (A), the cleaning means (C), the inspection means (D) and the sorting means (E). Use can be made of, among other parts, the above stated cameras for the data feed from the central control unit. The drive shafts and the manipulators of the separating device are of course coupled to drive means.

At least one of the manipulators is preferably provided with a guide running parallel to the saw blades. The positional accuracy of the manipulator during performing of an operation is hereby high, and control thereof relatively simple.

For the purpose of feeding electronic components to the separating device the positioning means comprise a feed position for feeding the electronic components for separating to the separating device. This is possible for instance with a cassette discharge station.

The separating device preferably further has a desirably modular structure in that, to the extent they are present, the positioning means (B), the sawing means (A), the cleaning means (C), the inspection means (D) and the sorting means (E) are accommodated successively in at least two individual frames, which frames can be releasably coupled. The advantages of a modular construction are simplified logistics, interchangeable modules in the case of maintenance and breakdown, and so on. A device is moreover thus obtained which is relatively simple to modify to customer requirements. It is of course desirable here that, to the extent they are present, the positioning means (B), the sawing means (A), the cleaning means (C), the inspection means (D) and the sorting means (E) are successively coupled to each other in series. It is also advantageous for a transfer position to be defined such that it is accessible to the manipulators of the means (A-E) adjacent to the transfer position.

The invention also provides a method for separating electronic components, comprising the processing steps of: L) following positioning of the electronic components for separating with positioning means, delivering the positioned electronic components at a transfer position, and M) re-engaging the positioned electronic components for subsequent separation thereof by means of sawing. Forming further improvements hereto are the additional processing steps of: N) delivering sawn electronic components at a transfer position, and O) re-engaging the sawn electronic components for the purpose of subsequent cleaning thereof. Another addition relates to: P) delivering the cleaned electronic components at a transfer position, and Q) re-engaging the cleaned electronic components for the purpose of subsequent inspection thereof. And forming part of yet another application of the method are the processing steps of: R) delivering the inspected electronic components at a transfer position, and S) re-engaging the inspected electronic components for the purpose of subsequent sorting thereof. It is the case for all these methods that it is hereby possible to shorten the cycle time of the separating device, this resulting in the advantages already described above.

In addition, the present invention also provides a method for separating electronic components, comprising the processing steps of: N) delivering sawn electronic components at a transfer position, and S) re-engaging the sawn electronic components for the purpose of subsequent sorting thereof. Also possible here are the processing steps of: L) following positioning of the electronic components for separating with positioning means, delivering the positioned electronic components at a transfer position, and M) re-engaging the positioned electronic components for subsequent separation thereof by means of sawing. Yet another preferred variant has the processing steps of: N) delivering sawn electronic components at a transfer position, and O) re-engaging the sawn electronic components for the purpose of subsequent cleaning thereof. It is further possible to provide the processing steps of: P) delivering the cleaned electronic components at a transfer position, and Q) re-engaging the cleaned electronic components for the purpose of subsequent inspection thereof. Finally, a method can also be envisaged with the additional processing steps of: R) delivering the inspected electronic components at a transfer position, and S) re-engaging the inspected electronic components for the purpose of subsequent sorting thereof. It is also the case for all these methods that it is hereby possible to shorten the cycle time of the separating device, this resulting in the advantages already described above.

The saw manipulator will in practice be moved above the saw blades. For this purpose the electronic components must be attached to the underside of the saw manipulator. Such engagement on the underside of a manipulator can also be applied for the other said manipulators. Different solutions can be envisaged in practice for this purpose, a practical solution being the engaging of the electronic components using underpressure.

BRIEF DESCRIPTION OF THE DRAWINGS

The present invention will be further elucidated on the basis of the non-limitative exemplary embodiments shown in the following figures. Herein.

DETAILED DESCRIPTION OF THE PREFERRED EMBODIMENTS

Figure 1:
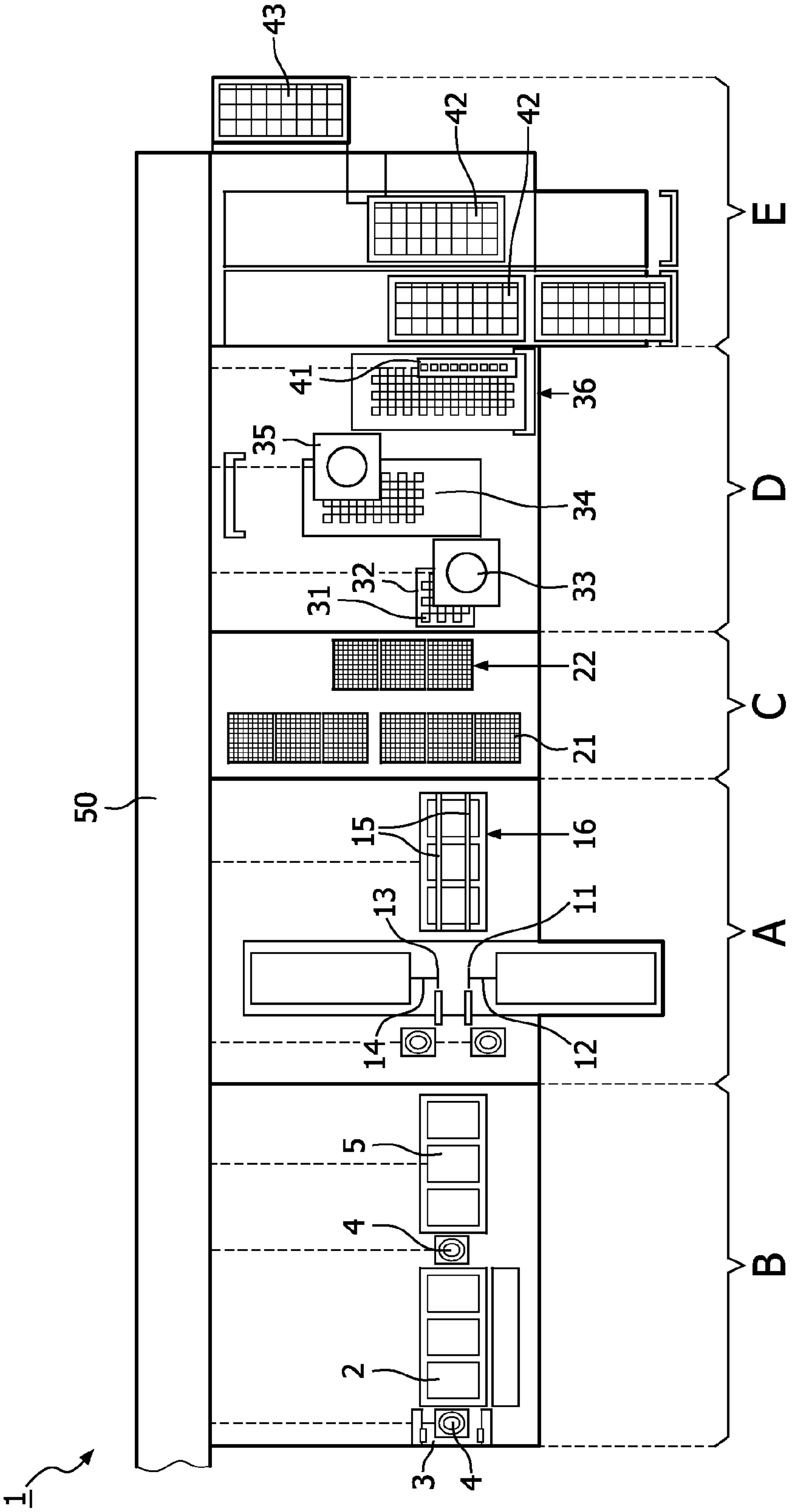
FIG. 1 shows a schematic top view of a separating device according to the invention.

FIG. 1 shows a top view of a separating device 1 which has a modular assembly of sawing means (A), positioning means (B), cleaning means (C), inspection means (D) and sorting means (E). For the sake of simplicity the manipulators are not shown in this top view.

Electronic components 2 for separating are supplied at a feed position 3 to positioning means (B) of separating device 1 and are subsequently detected with a number of cameras 4. Not only is the position determined here, the type of electronic component can also be determined. The electronic component is then laid off at a first transfer position 5. The electronic component is then taken up from the first transfer position 5 and fed to sawing means (A). These sawing means (A) are provided with two rotatable saw blades 11, 12 which are carried and rotated by respective rotation shafts 13, 14. Sawing means (A) in each case make two saw cuts (15) in the partially sawn electronic component 16 shown here. This will have to be carried a number of times along saw blades 11, 12 in order to arrive at a desired matrix division. The partially sawn electronic component 16 will here also have to be rotated in order to make transverse saw cuts. The processing cycle of sawing means (A) is usually longer than that of positioning means (B), cleaning means (C), inspection means (D) and sorting means (E), and is therefore the most critical operation from the viewpoint of capacity maximization.

Once the sawing operation by sawing means (A) is completed, the fully sawn electronic component is placed in the position in which the partially sawn electronic component 16 is shown in the figure. In this position (the second transfer position) the fully sawn electronic component is handed over by the cleaning manipulator (not shown) and fed to cleaning means (C). Just as for sawing means (A), positioning means (B), inspection means (D) and sorting means (E), multiple solutions are also known in the prior art for the cleaning means (C) as such. In cleaning means (C) shown schematically here the fully sawn electronic components for 21 are washed and dried in successive steps. From a third transfer position 22 they are gripped in a chequer-board configuration 31 (also referred to as "odd & even") by a very schematically shown transfer manipulator 32, and moved over an inspection camera 33. The electronic components (still in chequer-board configuration) are then placed on a platform 34, which platform 34 can be moved under a second inspection camera 35. After full inspection the electronic components are moved with platform 34 to a fourth transfer position 36. From the fourth transfer position 36 the electronic components are picked up in a sorting manipulator 41 and, subject to the previously detected data, displaced to a suitable lay-off position 41, 42 or to a waste area 43.

This figure also show schematically that sawing means (A), positioning means (B), cleaning means (C), inspection means (D) and sorting means (E) are all coupled to a central control unit 50. This control unit 50 is supplied with information from the different processing means, but also controls them (for instance by means of feed forward and by feed backward).

Figure 2:
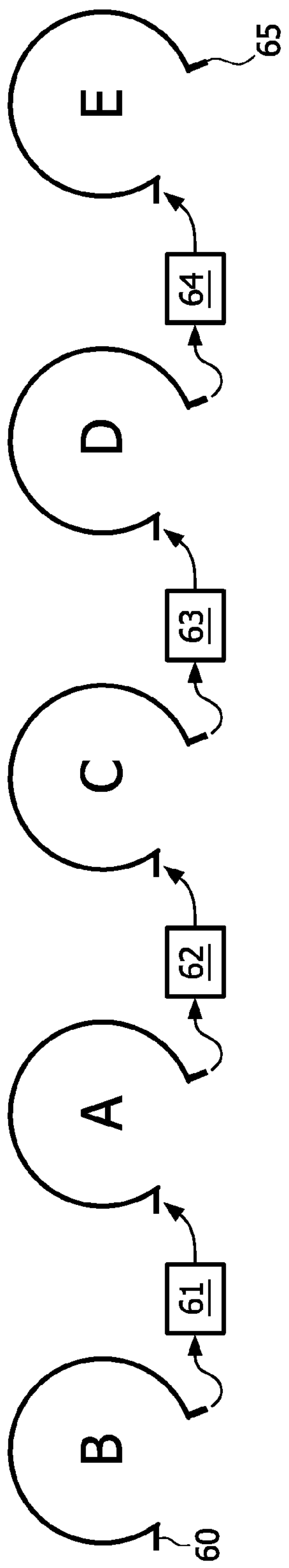
FIG. 2 shows the operation of a separating device even more schematically than in FIG. 1.

FIG. 2 shows abstractly the separating device 1, provided with sawing means (A), positioning means (B), cleaning means (C), inspection means (D) and sorting means (E) as successive sub-processes, wherein the electronic components are supplied at a feed position 60 to positioning means (B) and, after passing therethrough, are taken over at a first transfer position 61 by sawing means (A). The electronic components are subsequently moved over to cleaning means (C) at the second transfer position 62 and, after passing through these cleaning means (C), move over to inspection means (D) at the third transfer position 63. After passing through inspection means (D) the electronic components move over to sorting means (E) at the fourth transfer position 64, and there leave separating device 1 from a discharge position 65. The overall processing cycle of all successive processing steps normally amounts in the prior art to 40-70 seconds when encapsulated semiconductors are sawn into typical rectangular BGA products in the order of magnitude of 10×10 mm-12×12 mm, while the processing times of the individual processing steps are considerably shorter. The residence time of the electronic components for a specific situation of use is thus for instance 20 seconds in sawing means (A), 8-10 seconds in positioning means (B), 18 seconds in cleaning means (C), 15 seconds in inspection means (D) and 12 seconds in sorting means (E). The cycle time therefore amounts in this case to 20 seconds. It is particularly advantageous to substantially improve the utilization of the relatively expensive separation unit in order to achieve a maximum output; for this purpose all sub-processes other than the separation have a shorter cycle time than the separation.

Figure 3:
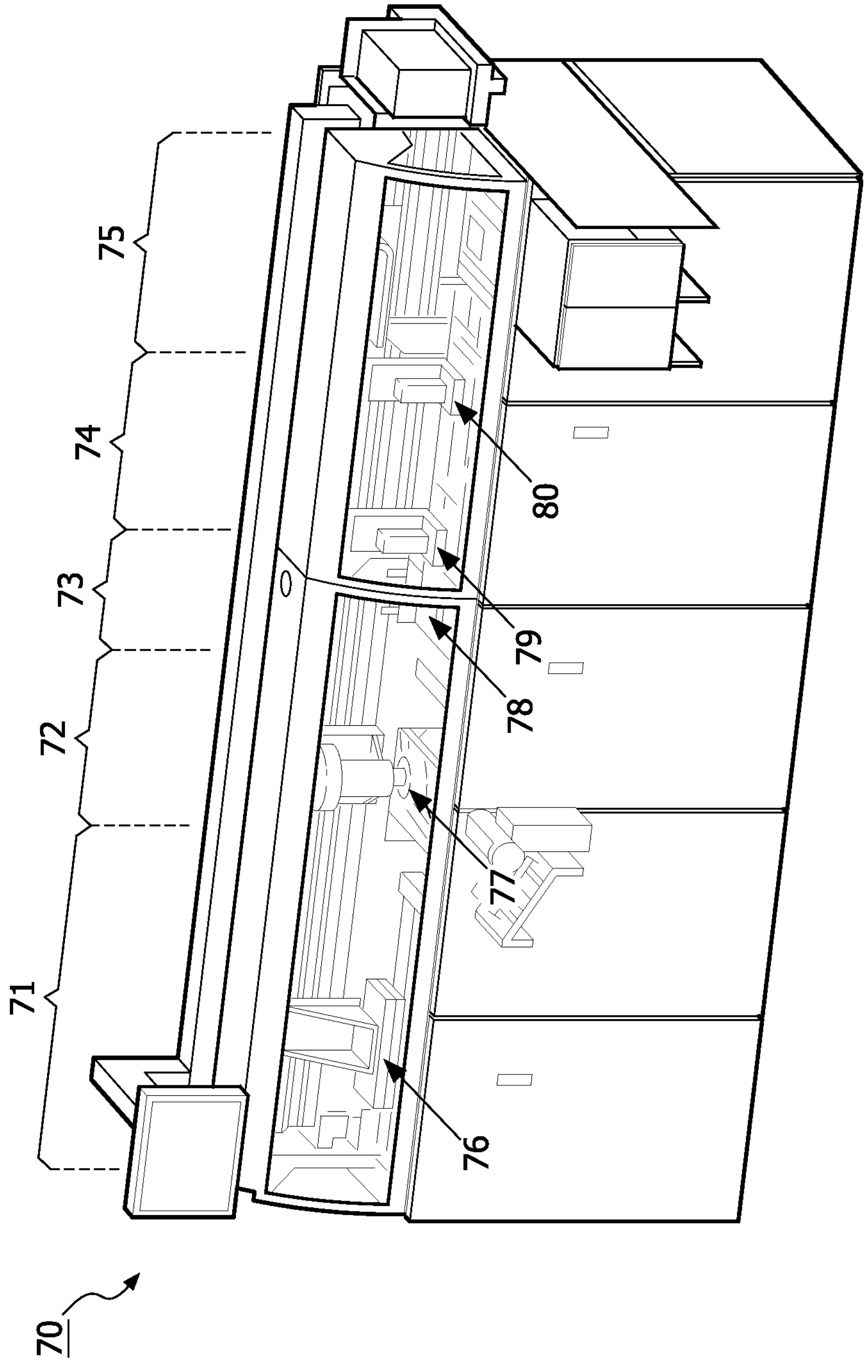
FIG. 3 is a perspective view of the device according to the present invention.

FIG. 3 shows a perspective view of a separating device 70. Separating device 70 successively integrates positioning means 71, sawing means 72, cleaning means 73, inspection means 74 and sorting means 75. Said means each comprise respectively a manipulator of their own: a positioning manipulator 76, a saw manipulator 77, a cleaning manipulator 78, an inspection manipulator 79 and a sorting manipulator 80. In the separating device 70 shown in this figure the positioning means 71, sawing means 72, cleaning means 73, inspection means 74 and sorting means 75 operate serially, but are separated from each other by the individual manipulators 76-80.

The invention claimed is:

1. A device for separating electronic components, comprising:

sawing means for sawing the electronic components, said sawing means comprising two parallel and rotatable drive shafts with a saw blade mounted on each of the shafts, and a saw manipulator for engaging, carrying and displacing the electronic components relative to the saw blades; and positioning means for aligning the electronic components for separating before they are fed to the sawing means, said positioning means comprising at least one camera for detecting the position of supplied electronic components for separating, and a positioning manipulator for engaging, carrying and displacing the electronic components for separating relative to the camera;

wherein between the positioning means and the sawing means at least one transfer position is defined for the purpose of transferring positioned electronic components between the positioning means and the sawing means.

2. The separating device as claimed in claim 1, further comprising:

cleaning means for cleaning the separated electronic components after they have been processed by the sawing means, said cleaning means comprising a washing system for washing the separated electronic components using a cleaning liquid, and a cleaning manipulator for engaging, carrying and displacing the separated electronic components relative to the washing system;

wherein between the sawing means and the cleaning means at least one transfer position is defined for the purpose of transferring sawn electronic components between the sawing means and the cleaning means.

3. The separating device as claimed in claim 2, further comprising:

inspection means for inspecting the cleaned and separated electronic components after they have been processed by the cleaning means, said inspection means comprising at least one inspection camera for inspecting the cleaned and separated electronic components, and an inspection manipulator for engaging, carrying and displacing the cleaned and separated electronic components relative to the inspection camera;

wherein between the cleaning means and the inspection means at least one transfer position is defined for the purpose of transferring cleaned electronic components between the cleaning means and the inspection means.

4. The separating device as claimed in claim 3, further comprising:

sorting means for sorting the inspected, cleaned and separated electronic components after they have been detected by the inspection means, said sorting means comprising at least two transfer positions for inspected, cleaned and separated electronic components, and a sorting manipulator for engaging, carrying and displacing the inspected, cleaned and separated electronic components to the different transfer positions;

wherein between the inspection means and the sorting means at least one transfer position is defined for the purpose of transferring inspected electronic components between the inspection means and the sorting means.

5. The separating device as claimed in claim 1, wherein the device is provided with a central control unit co-acting with at least two of the positioning means, the sawing means, the cleaning means, the inspection means, and the sorting means.

6. The separating device as claimed in claim 4, wherein the positioning means, the sawing means, the cleaning means, the inspection means, and the sorting means are successively coupled to each other in series.

7. The separating device as claimed in claim 1, wherein the at least one transfer position is defined such that it is accessible to said manipulators.

8. The separating device as claimed in claim 4, wherein the positioning means, the sawing means, the cleaning means, the inspection means, and the sorting means are accommodated successively in at least two individual frames, which frames can be releasably coupled.

9. A device for separating electronic components, comprising:

sawing means for sawing the electronic components, said sawing means comprising two parallel and rotatable drive shafts with a saw blade mounted on each of the shafts, and a saw manipulator for engaging, carrying and displacing the electronic components relative to the saw blades;

positioning means for aligning the electronic components for separating before they are fed to the sawing means, said positioning means comprising at least one camera for detecting the position of supplied electronic components for separating, and a positioning manipulator for engaging, carrying and displacing the electronic components for separating relative to the camera;

inspection means for inspecting the separated electronic components, said inspection means comprising at least one inspection camera for inspecting the separated electronic components, and an inspection manipulator for engaging, carrying and displacing the separated electronic components relative to the inspection camera; and sorting means for sorting the separated electronic components, said sorting means comprising at least two transfer positions for separated electronic components, and a sorting manipulator for engaging, carrying and displacing the separated electronic components to different transfer positions;

wherein between the positioning means and the sawing means at least one transfer position is defined for the purpose of transferring positioned electronic components between the positioning means and the sawing means, and wherein between the inspection means and the sorting means at least another transfer position is defined for the purpose of transferring the inspected separated electronic components between the inspection means and the sorting means.

10. The separating device as claimed in claim 1, wherein at least one transfer position is accessible to the positioning manipulator for the purpose of delivering electronic components for separating with the positioning manipulator, and wherein the at least one transfer position is accessible to the saw manipulator for the purpose of engaging with the saw manipulator the electronic components for separating which are delivered by the positioning manipulator.

* * * * *